(12) United States Patent
Treadway et al.

(10) Patent No.: US 11,152,463 B2
(45) Date of Patent: Oct. 19, 2021

(54) SEMICONDUCTOR NANOCRYSTAL STRUCTURE AND OPTOELECTRONIC DEVICE

(71) Applicant: OSRAM Opto Semiconductors GmbH, Regensburg (DE)

(72) Inventors: Joseph A. Treadway, Portland, OR (US); Benjamin Daniel Mangum, Tualatin, OR (US); David O'Brien, Portland, OR (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 22 days.

(21) Appl. No.: 16/822,213

(22) Filed: Mar. 18, 2020

(65) Prior Publication Data
US 2021/0296440 A1 Sep. 23, 2021

(51) Int. Cl.
*H01L 29/06* (2006.01)
*H05K 9/00* (2006.01)
*H01L 23/552* (2006.01)

(52) U.S. Cl.
CPC ........ *H01L 29/0665* (2013.01); *H01L 23/552* (2013.01); *H05K 9/0081* (2013.01)

(58) Field of Classification Search
CPC .......................... H01L 29/0665; H01L 23/552
See application file for complete search history.

(56) References Cited

U.S. PATENT DOCUMENTS

| 2005/0017260 | A1* | 1/2005 | Lee ................. | G02F 1/3556 |
| | | | | 257/101 |
| 2011/0226991 | A1* | 9/2011 | Treadway .......... | B82Y 30/00 |
| | | | | 252/301.6 S |
| 2018/0033856 | A1* | 2/2018 | Kwon ................ | H01L 33/18 |
| 2018/0094190 | A1* | 4/2018 | Kim .................. | H01L 29/0665 |

FOREIGN PATENT DOCUMENTS

WO 2007020416 A1 2/2007

OTHER PUBLICATIONS

Battaglia, D. et al., "Colloidal Two-Dimensional Systems: CdSe Quantum Shells and Wells", Angewandte Chemie International Edition, Oct. 27, 2003, pp. 5035-5039, vol. 42, No. 41.
Borchert, H. et al., "Photoemission Study of Onion Like Quantum Dot Quantum Well and Double Quantum Well Nanocrystals of CdS and HgS", The Journal of Physical Chemistry B, Jan. 30, 2003, pp. 7486-7491, vol. 107, No. 30.

(Continued)

*Primary Examiner* — Hung V Ngo
(74) *Attorney, Agent, or Firm* — Viering, Jentschura & Partner MbB

(57) ABSTRACT

A semiconductor nanocrystal structure may include a core, an inner absorption shell surrounding the core, at least one emission shell surrounding the inner absorption shell, and an outer absorption shell surrounding the emission shell(s). The core may include a different material than the optional inner absorption shell and/or the outer absorption shell. The core may be less absorbent to electromagnetic radiation as compared to the optional inner absorption shell and/or the outer absorption shell. An optoelectronic device may include the semiconductor nanocrystal structure.

19 Claims, 5 Drawing Sheets

(56) References Cited

OTHER PUBLICATIONS

Chen, Y. et al.: ""Giant" Multishell CdSe Nanocrystal Quantum Dots with Suppressed Blinking", Journal of the American Chemical Society, Mar. 20, 2008, pp. 5026-5027, vol. 130, No. 15.
Jeong, B. G. et al., "Colloidal Spherical Quantum Wells with Near-Unity Photoluminescence Quantum Yield and Suppressed Blinking", ACS Publications, Oct. 2, 2016, pp. 9297-9305.
Mews, A. et al., "Preparation, Characterization, and Photophysics of the Quantum Dot Quantum Well System CdS/HgS/CdS", The Journal of Physical Chemistry A, 1994, pp. 934-941, vol. 98, No. 3.
Yin, Y. et al., "Formation of hollow nanocrystals through the nanoscale Kirkendall effect", Science, Mar. 11, 2004, 19 pages, vol. 304.
Specification of U.S. Appl. No. 62/865,759, "Quantum Dot Structure and Method of Producing a Quantum Dot Structure", 47 pages.
Daniels, S. M. et al., "New Zinc and Cadmium Chalcogenide Structured Nanoparticles", MRS Online Proceedings Library, published 2003, pp. 31-36, Materials Research Society symposia proceedings, vol. 789.
International Search Report issued for the European patent application No. PCT/EP2021/056699, dated Jun. 23, 2021 14 pages (for informational purposes only).

\* cited by examiner

SEMICONDUCTOR NANOCRYSTAL STRUCTURE AND OPTOELECTRONIC DEVICE

TECHNICAL FIELD

The invention relates to a semiconductor nanocrystal, and further relates to an optoelectronic device including the semiconductor nanocrystal.

BACKGROUND

It is an object of one or more embodiments to provide a semiconductor nanocrystal structure with tunable absorption and emission properties. It is a further object to provide an optoelectronic device comprising a semiconductor nanocrystal structure with tunable absorption and emission properties.

SUMMARY

According to at least one embodiment, a semiconductor nanocrystal structure may be configured or designed to absorb incident electromagnetic radiation of a first wavelength range, i.e. a primary radiation, and convert the primary radiation into electromagnetic radiation of a second wavelength range, i.e. a secondary radiation, and emit the secondary radiation. In other words, the semiconductor nanocrystal structure may be or include a conversion material.

According to at least one embodiment, the semiconductor nanocrystal structure may include a core. The core is configured or designed for carrier confinement, for example, for pushing (or confining) carriers to one or more other regions of the semiconductor nanocrystal structure, such as emissive regions. The core may include or consist of a high bandgap material or an insulator material. For example, the core may include or consist of ZnS, polystyrene, polysilica, or combinations thereof. Alternatively, the core may be an empty space creating a "hollow" in the semiconductor nanocrystal structure. In that case, the core may include or consists of air or another gas. In a non-limiting embodiment when the core is filled with air or gas, the inner absorption shell surrounds the core of air.

The core may be arranged, e.g. centrally, in the semiconductor nanocrystal structure. The core may be enclosed in or surrounded by at least two shells.

According to at least one embodiment, the semiconductor nanocrystal structure may include an optional inner absorption shell surrounding the core. The optional inner absorption shell may be configured or designed to absorb primary radiation. The inner absorption shell may include or consist of a semiconductor material, for example, a III-V semiconductor material such as InP or a II-VI semiconductor material such as CdS or CdSe. In some embodiments, the inner absorption shell is not required and, thus, may be omitted.

According to at least one embodiment, the semiconductor nanocrystal structure may include at least one emission shell surrounding the inner absorption shell. The emission shell may be configured or designed to convert primary radiation into secondary radiation and to emit the secondary radiation. If the inner absorption shell is omitted, the emission shell(s) may surround the core directly thereby abutting the core. The emission shell may include or consist of a semiconductor material, for example, a III-V semiconductor material or a II-VI semiconductor material, such as CdSe.

According to at least one embodiment, the semiconductor nanocrystal structure may include an outer absorption shell surrounding the emission shell(s). The outer absorption shell may be configured or designed to absorb primary radiation. The outer absorption shell may include or consists of a semiconductor material, for example, a III-V semiconductor material or a II-VI semiconductor material, such as InP, CdS, CdSe, or combinations thereof. The material of the outer absorption shell may be the same or a different material than the material of the inner absorption shell.

As defined herein, one element, such as a layer or a shell, surrounding another element such as a layer or a shell, or a core is to be understood that the one (outer) element encloses or surrounds the other (inner) element at least partially, or completely. The two elements can be in direct mechanical contact or not in direct mechanical contact, i.e. the two elements can be spaced apart from each other.

In a non-limiting embodiment, the core may be in direct mechanical contact to the inner absorption shell, the inner absorption shell may be in direct mechanical contact to the emission shell(s), and the emission shell(s) is in direct mechanical contact to the outer absorption shell. If the inner absorption shell is omitted, the core may be in direct mechanical contact to the emission shell(s).

According to at least one embodiment, the core may include a different material than the inner absorption shell and/or the outer absorption shell. In other words, the core may include a different material than at least one of the following shells: the inner absorption shell, the outer absorption shell. In particular, the material of the core has a higher bandgap than the material of the inner absorption shell and/or the outer absorption shell. Alternatively, the core may include a material without a bandgap or with a high bandgap of greater than 4 eV, for instance, an insulator.

According to at least one embodiment, the core absorbs less electromagnetic radiation as compared to the inner absorption shell and/or the outer absorption shell. In other words, the core absorbs less electromagnetic radiation than one or both of the following shells: the inner absorption shell, the outer absorption shell. As defined herein, "absorbs less electromagnetic radiation" means that the core absorbs less of the energy of the electromagnetic radiation. In particular, the core absorbs at least 50%, at least 60%, at least 70%, at least 80%, or at least 90% less energy of the electromagnetic radiation as compared to the inner absorption shell and/or the outer absorption shell.

In particular, the core may be less absorbent at a target wavelength range. The target wavelength range is to be understood as being the desired wavelength range in the region of interest including both the primary radiation absorbed by the semiconductor nanocrystal structure and the secondary radiation emitted from the semiconductor nanocrystal structure. In other words, the target wavelength range is the useful wavelength range. In particular, the core absorbs less electromagnetic radiation when a wavelength is in the wavelength range of the absorption and/or emission shells, for example, the UV or visible or infrared wavelength range. In particular, the core is less absorbing to electromagnetic radiation of the primary radiation, for example, at 450 nm. In other words, the core is non-optically active. In a semiconductor nanocrystal structure, the quantum efficiency can be significantly increased for a decreasing absorption of the core compared to the absorption of the absorption shells.

According to at least one embodiment, the semiconductor nanocrystal structure may include a core, an optional inner absorption shell surrounding the core, emission shell(s)

surrounding the inner absorption shell, and an outer absorption shell surrounding the emission shell(s), wherein the core may include a different material than the inner absorption shell and/or the outer absorption shell, and the core absorbs less electromagnetic radiation as compared to the inner absorption shell and/or the outer absorption shell.

A semiconductor nanocrystal structure with a non-optically active core being surrounded by absorption and emission shells allows one to tune the energy bandgap and thus the spectral absorption and/or emission independently from the quantity of absorbing and/or emitting material and so the absolute absorption and/or emission of the structure. This enables significantly more freedom in the engineering of the optical properties of the semiconductor nanocrystal.

In core-shell quantum dots with an emissive core and absorptive shells, the energy bandgap and the absorption volume are linked. To achieve a high absorber volume, the absorption shells have dimensions where the absorption is defined by the bulk absorption of the material. Thus, core-shell quantum dots either have sub-optimal bandgap alignments, but high absorber volumes or optimal bandgap alignments, but absorber volumes smaller than desired.

The thickness of a layer or shell is a main parameter for determining the energy bandgap. Thus, the energy bandgaps of the inner absorption shell, the emission shell(s), the outer absorption shell, and combinations thereof in the semiconductor nanocrystal structure can be tuned by the thickness of the respective shell. In other words, the energy bandgaps of the inner absorption shell, the emission shell(s), the outer absorption shell, and combinations thereof are defined by the layer thickness of the shells and not by the bulk material bandgaps.

In particular, the amount of material of the shells surrounding the core can be tuned independently of the dimension that determines the bandgap confinement by varying the radius of the core. In other words, the comparatively large core serves as a template for thin shells. For spheroidal or spherical structures, the volume of the material in the shells increases with the cube of the shell radius to allow for a significant amount of material for absorption, while maintaining the ability to tune the energy bandgap and thus the spectral region of the absorption or emission. The stokes shift can then be engineered independently from the absolute level of absorption. This is a significant advantage compared to core-shell quantum dots with an emissive core and absorptive shells.

Furthermore, defining the energy bandgap by a layer thickness also opens the possibility of bringing together materials that may work well from a synthesis standpoint, such as lattice matching of crystals or complementary chemistry, but would previously have not been useful from an energy bandgap standpoint. For example, materials with a good lattice matching but an incompatible bandgap in the bulk material can be used when redefining the energy bandgaps by the layer thicknesses to match each other.

In addition, as the layer is relatively thin, the strain that may result from that mismatch can remain below levels that may cause defects. Thus, the semiconductor nanocrystal structure described here provides additional freedom in material choice and enables the use of materials that were incompatible until now.

According to at least one embodiment, the inner absorption shell, the emission shell, and the outer absorption shell form a quantum well structure. In a quantum well structure, the emission shell is arranged between two absorption shells. The absorption shells both have a higher energy bandgap than the emission shell. For example, the quantum well structure may have an inner absorption shell comprising CdS, an emission shell comprising CdSe, and an outer absorption shell comprising CdS. In particular, the quantum well structure utilizes the core as a template.

In particular, the quantum well structure described here allows for quantum confined absorber layers. Typically, the absorber layers must be bulk sized or nearly bulk sized in order to absorb as much light as possible. In the quantum confined absorber layers described here, the absorber layers can both absorb a great deal of light due to overall absorber layer volume, but still be quantum confined in the thin dimension. This makes it possible to use materials that would otherwise be too small in bandgap. For example, InP has a bandgap comparable to CdSe, but thin quantum confined InP would have a smaller bandgap than CdSe with a large bandgap making InP a candidate for an absorber material.

In a further embodiment, the semiconductor nanocrystal structure is a spheroidal, in particular spherical, quantum well with a high bandgap core. In particular, the core may include or consist of air and thus leave an empty space around which the inner absorption shell, the emission shell and the outer absorption shell can form a "hollow" quantum well structure.

According to at least one embodiment, the bandgap of the emission shell and/or the inner absorption shell and/or the outer absorption shell increases with decreasing thickness of the respective shell. In other words, the bandgap of at least one of the following shells increases with decreasing thickness of the respective shell: the emission shell, the inner absorption shell, the outer absorption shell. In particular, the respective bandgap has a steady increase over a certain decreasing thickness range of the respective shell. With decreasing thickness, it is possible to increase the energy bandgap of both the emission shell and the absorption shells and thus, decrease the wavelength of the absorbed primary radiation and/or emitted secondary radiation. In particular, the bandgaps of the shells can be determined independently of one another. Thus, it is possible to spectrally separate the absorption and the emission of the semiconductor nanocrystal to avoid the semiconductor nanocrystal reabsorbing the light it emits. Reducing the re-absorption is advantageous for increasing the overall quantum yield.

According to at least one embodiment, the emission shell and/or the inner absorption shell and/or the outer absorption shell is quantum confined. In other words, at least one (or more) of the following shells is quantum confined: the emission shell, the inner absorption shell, the outer absorption shell. Here and in the following, quantum confined is to be understood as meaning that the bandgap changes as a function of size. Here, the size of the shells refers to the thickness of the shells. The thickness of each shell may be a uniform thickness in a non-limiting embodiment; alternatively, the thickness may vary depending on the needs of the nanocrystal semiconductor structure. Thus, in a quantum confined shell, the energy bandgap changes as a function of the shell thickness. Generally, quantum confinement is only observed if the respective thickness of the shell(s) are small, in particular, in the nanometer range, for example, smaller than or equal to 10 nm, such as 0.1 nm to 10 nm.

It should be noted, however, that the thickness of the shells for quantum confinement depends on the specific material. Quantum confinement is advantageous for specifically determining the absorption and/or emission wavelength of the semiconductor nanocrystal without being bound to the bulk material bandgaps.

According to at least one embodiment, the semiconductor nanocrystal structure has a symmetric or an asymmetric shape. For instance, the semiconductor nanocrystal structure has a basic shape of a sphere, a rod, a cylinder, a tetrahedron, an ellipsoid, a rectangular solid, a hexagonal solid, or asymmetric combinations of these structures such as a rod with a flat end and a pyramid end. According to at least one embodiment, the semiconductor nanocrystal structure is spheroidal, in particular spherical. For spheroidal, in particular spherical, semiconductor nanocrystal structures, the volume of the material in the shells increases with the cube of the shell radius, thus enabling quantum confinement, while allowing for a significant amount of material for absorption and/or emission.

According to at least one embodiment, the thickness of at least one or more of the following shells is less than or equal to 10 nm, such as 0.1 nm to 10 nm: the emission layer, the inner absorption layer, the outer absorption layer.

According to at least one embodiment, the thickness of the emission shell is less than or equal to 10 nm, in particular less than or equal to 5 nm, such as less than or equal to 3 nm such as from 0.1 nm independently to 10 nm, in particular from 1 nm independently to 5 nm, or from 1.5 nm independently to 3 nm. As used herein with respect to a range, "independently" means that any threshold may be used together with another threshold to give a suitable alternative range, e.g. about 0.1 nm independently to about 3 nm is also considered a suitable alternative range.

According to at least one embodiment, the thickness of the inner absorption shell and/or outer absorption shell is less than or equal to 10 nm, such as from 0.1 nm independently to 10 nm, in particular from 1 nm independently to 5 nm, or from 1.5 nm independently to 3 nm. "As used herein with respect to a range, "independently" means that any threshold may be used together with another threshold to give a suitable alternative range, e.g. about 0.1 nm independently to about 3 nm is also considered a suitable alternative range.

As defined herein, thickness of the shells is defined as their broadest expansion between the core and surroundings of the semiconductor nanocrystal structure. For spheroidal or spherical semiconductor nanocrystal structures, for example, the thickness of a shell is determined by subtracting the inner radius of the shell from the outer radius of the shell. Shells with thicknesses of less than or equal to 10 nm can be quantum confined, and the bandgaps of both the emission and absorption can be defined by the layer thickness of the structures rather than the bulk material bandgaps thus resulting in independently tunable optical properties of the semiconductor nanocrystal.

According to at least one embodiment, the inner absorption shell and the outer absorption shell may include or consist of the same material. For instance, the inner absorption shell and the outer absorption shell may include or consist of CdS. Using CdS has the advantage of synthetic convenience and therefore potential cost savings. Alternatively or additionally, the inner absorption shell and the outer absorption shell may include or consist of CdSe or InP. CdSe and InP are particularly suited for quantum confined absorber layers as their bulk bandgaps are too small for absorber layers, but can be engineered by quantum confining the material to meet the requirements of absorber layers.

According to at least one embodiment, the core is less absorbing to electromagnetic radiation in the visible wavelength range than the inner absorption shell and/or the outer absorption shell. In particular, the core is less absorbing for wavelength greater than 400 nm than the inner absorption shell and/or the outer absorption shell. In that case, the core is less absorbing to the primary and/or secondary radiation and thus enables carrier confinement in the absorption shells and the emission shell.

According to at least one embodiment, the semiconductor nanocrystal structure further includes a passivation shell surrounding the outer absorption shell. In particular, the passivation shell is in direct mechanical contact to the outer absorption shell. The passivation shell is configured or designed for electronic passivation. The passivation shell may include a high bandgap material, for example, ZnS, CdS, ZnSe and/or GaP. In particular, the passivation shell may include a material with a higher bandgap than the inner absorption shell, the emission shell, and the outer absorption shell. The passivation shell improves carrier confinement and thus the radiative transition rates of the semiconductor nanocrystal.

According to at least one embodiment, the core and the passivation shell may include or consist of the same material. For example, the core and the passivation shell may include or consist of ZnS. A core and a passivation shell comprising the same material further may improve carrier confinement.

According to at least one embodiment, the semiconductor nanocrystal structure further includes a barrier layer surrounding the passivation shell. In particular, the barrier layer is in direct mechanical contact to the passivation shell. The barrier layer is configured or designed as an encapsulation to protect the encapsulated core and shells against external influences like oxygen or water and thus against degradation. Furthermore, it can facilitate embedding the semiconductor nanocrystal structure into matrix materials, for example, a silicone matrix. In particular, the barrier layer may include a dielectric material, for example, a metal oxide such as silica, alumina, zirconia, hafnium oxide, strontium oxide and/or tin oxide.

According to at least one embodiment, the inner absorption shell and/or the emission shell and/or the outer absorption shell may include at least two regions. In other words, at least one of the following shells may include at least two regions: the inner absorption shell, the emission shell, the outer absorption shell. Thus, each of the shells might be expanded into two or more "sub"-shells. Often, "sub"-shells can be blended materials comprising the materials on either side. In a non-limiting embodiment, each of the two or more "sub"-shells includes the same material. Expanding shells into two or more regions can release epitaxial strain between shells or the core and the adjacent shell, in particular between absorption layers and higher bandgap materials, for example, the material of the core or the passivation shell, if present.

According to at least one embodiment, the semiconductor nanocrystal structure may include multiple emission shells and intermediate absorption shells are arranged between the emission shells. In other words, the semiconductor nanocrystal structure may include a multiple quantum well structure, wherein the pattern of absorption shell-emission shell-absorption shell can be extended multiple times. For example, the semiconductor nanocrystal structure may include an inner absorption shell, three emission shells with two intervening intermediate absorption shells and an outer absorption shell. The material of the multiple emission shells can be the same or different for each emission shell. The material of the absorption shells has a higher bandgap than the material of the emission shells and can be the same or different for each absorption shell. In a non-limiting embodiment, all emission shells may include an identical first material and all absorption shells may include an identical second material different from the material of the emission shells.

According to at least one embodiment, the shells are blended at interfaces between the shells. In this context, the term "shells" refers to any shells mentioned herein, for instance, any absorption shells, any emission shells, and the passivation shell. In particular, the shells might be blended at interfaces through alloying. In other words, the interface between two adjacent shells may include an alloy of the material of the one shell and of the other shell. For example, if one shell includes CdS, and the other shell includes ZnS, the shells can be blended at the interface between the shells forming a CdZnS alloy. In particular, blended interfaces may include a grading. In this case, a concentration of a chemical element of the one shell not present in the other shell decreases within the blended interface from the one layer to the other layer, while the concentration of a chemical element of the other shell not present in the one shell increases from the one layer to the other layer. For example, a Cd concentration may decrease, while a Zn concentration may increase within the blended interface from a CdS shell to a ZnS shell. Blended interfaces through alloying result in lower epitaxial strain between the shells.

Another aspect relates to an optoelectronic device. In a non-limiting embodiment, the optoelectronic device described here may include a plurality of semiconductor nanocrystal structures described above. Features and embodiments of the semiconductor nanocrystal structure are also disclosed for the optoelectronic device and vice versa.

The optoelectronic device is a device configured or designed to emit electromagnetic radiation during operation. For example, the optoelectronic device is a light-emitting diode (LED).

According to at least one embodiment, the optoelectronic device may include a semiconductor chip configured to emit a primary radiation and a conversion element configured to convert at least part of the primary radiation into a secondary radiation. The conversion element may include a plurality of semiconductor nanocrystal structures comprising a core, an inner absorption shell surrounding the core, emission shell(s) surrounding the inner absorption shell, and an outer absorption shell surrounding the emission shell(s). The core may include a different material than the inner absorption shell and/or the outer absorption shell, and the core is less absorbing to electromagnetic radiation than the inner absorption shell and/or the outer absorption shell.

The semiconductor chip may include an active layer stack comprising an active region that emits the primary radiation during operation of the device. The semiconductor chip is, for example, a light-emitting diode chip or a laser diode chip. The primary radiation generated in the semiconductor chip can be emitted through a radiation emission surface of the semiconductor chip. In particular, the semiconductor chip emits a primary radiation in the visible wavelength range during operation, such as with wavelengths greater than 400 nm. For example, the semiconductor chip emits the primary radiation in the wavelength range from 400 nm inclusive to 950 nm inclusive.

The semiconductor nanocrystal structures in the conversion element are configured to convert the primary radiation at least partially or completely into a secondary radiation. In particular, the secondary radiation has a wavelength range that is at least partially, such as completely different from the wavelength range of the primary radiation. "At least partially" defined in this sense refers to a wavelength of the secondary wavelength range that overlaps with the primary wavelength range; whereas, "completely different" refers to a secondary wavelength range that does not overlap with the primary wavelength range. In a non-limiting embodiment, the wavelength range of the secondary radiation is in the visible and/or infrared wavelength range. For example, the secondary radiation may include a wavelength rage from 450 nm inclusive to 1500 nm inclusive.

The features of the semiconductor nanocrystal structure have already been disclosed in conjunction with the semiconductor nanocrystal structure and also apply to the semiconductor nanocrystal structures in the optoelectronic device.

Such an optoelectronic device can be used for emitting white light or colored light. A further application of the optoelectronic device is the conversion of red light to near-infrared light. Due to the semiconductor nanocrystal structures in the conversion element, the absorption and the emission can be spectrally separated to avoid the semiconductor nanocrystal structure reabsorbing the light it emits. Since reabsorption events are detrimental to the overall quantum yield of the conversion process, spectrally separating the absorption and the emission increases the overall quantum yield.

According to at least one embodiment, the conversion element is arranged on the radiation emission surface of the semiconductor chip. In other words, the conversion element is arranged in a beam path of the semiconductor chip.

According to at least one embodiment, the conversion element is arranged in direct mechanical contact to the semiconductor chip. In particular, the conversion element is arranged in direct mechanical contact to the radiation emission surface of the semiconductor chip.

According to at least one embodiment, the semiconductor chip and/or the conversion element are encapsulated in an encapsulation. The encapsulation may include or consist of silicone, polysiloxane, epoxy, or combinations thereof.

According to at least one embodiment, the conversion element and the semiconductor chip are spaced apart, i.e. are not directly contacting each other. Alternatively, other layers or elements can be arranged between the conversion element and the semiconductor chip. For instance, the conversion element can be applied to the radiation emission surface of the semiconductor chip with an adhesive layer or the encapsulation surrounding the semiconductor chip can be arranged between the semiconductor chip and the conversion element.

According to at least one embodiment, the conversion element may include a matrix material and the semiconductor nanocrystal structures are embedded in the matrix material. In particular, the semiconductor nanocrystal structures are homogeneously distributed in the matrix material. The matrix material may include or consist of silicone, polysiloxane, epoxy or combinations thereof.

BRIEF DESCRIPTION OF THE DRAWINGS

Non-limiting embodiments and developments of the conversion layer, the light-emitting device, and the method of producing a light-emitting device will become apparent from the non-limiting embodiments described below in conjunction with the figures.

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

DETAILED DESCRIPTION

FIGS. 1 to 4 each show an exemplary embodiment of a semiconductor nanocrystal structure 1.

Figure 1:
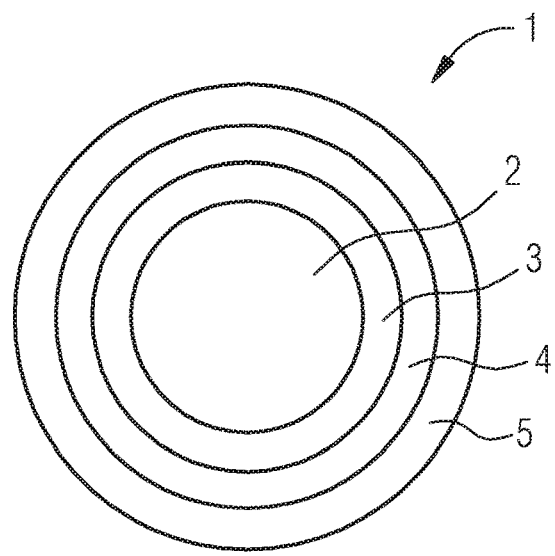
FIGS. 1 to 4 each show a schematic illustration of a semiconductor nanocrystal structure according to different embodiments.

The semiconductor nanocrystal structure 1 of FIG. 1 may include a core 2, an optional inner absorption shell 3 surrounding the core 2, and emission shell 4 surrounding the inner absorption shell 3 and an outer absorption shell 5 surrounding the emission shell 4. The inner absorption shell 3, the emission shell 4 and the outer absorption shell 5 may form a quantum well structure utilizing the core 2 as a template. The inner absorption shell 3 and the outer absorption shell 5 each may include the same or a different material having a higher bandgap than the material of the emission shell 4. The core 2 may include a material either having a higher bandgap than the absorption shells 3,5 or being an insulator. For example, the core 2 may include ZnS; the inner absorption shell 3 may include CdS; the emission shell 4 may include CdSe; and the outer absorption shell 5 may include CdS. For instance, the inner absorption shell 3, the emission shell 4, and the outer absorption shell 5 may have a thickness of less than or equal to 10 nm.

Figure 2:
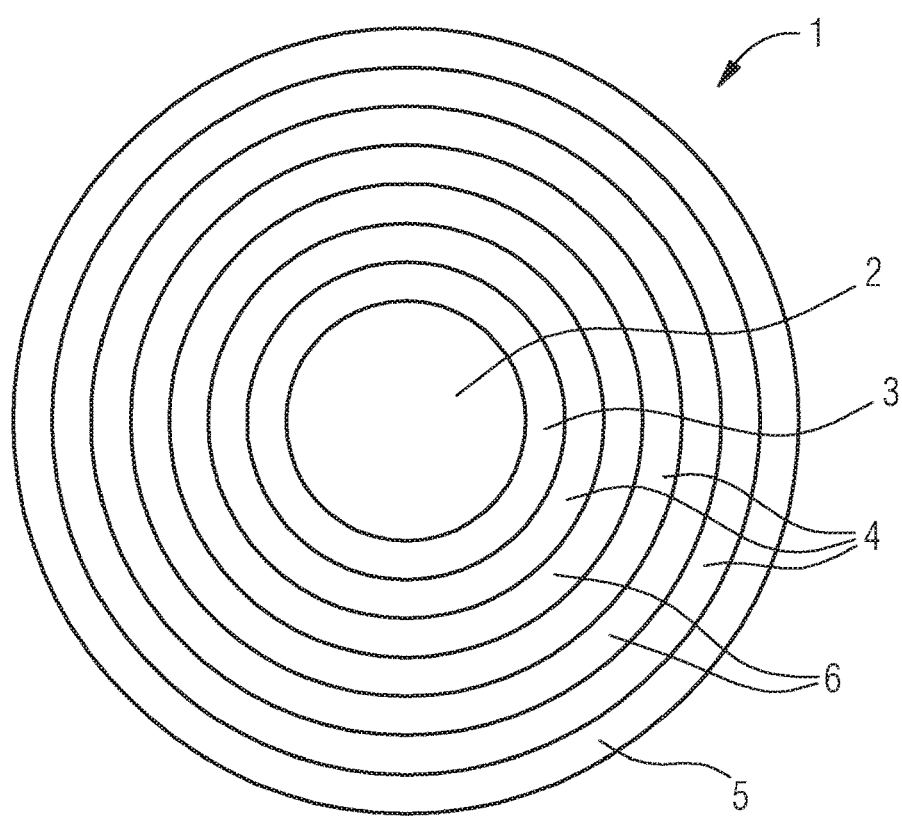

Compared to the semiconductor nanocrystal structure 1 of FIG. 1, the semiconductor nanocrystal structure 1 of FIG. 2 may include three emission shells 4 arranged between the inner absorption shell 3 and the outer absorption shell 5. Two intermediate absorption shells 6 are arranged between the emission shells 4. The emission shells 4 may have the same material or different materials. The intermediate absorption shells 6 each may have the same or a different material, but the material of the intermediate absorption shells 6 may have a higher bandgap than the emission shells 4. In particular, the intermediate absorption shells 6 may include the same material as the inner absorption shell 3 and/or the outer absorption shell 5. In particular, the emission shells 4 and the absorption shells 3,5,6 in the semiconductor nanocrystal structure 1 in the exemplary embodiment of FIG. 2 form a multiple quantum well structure.

Figure 3:
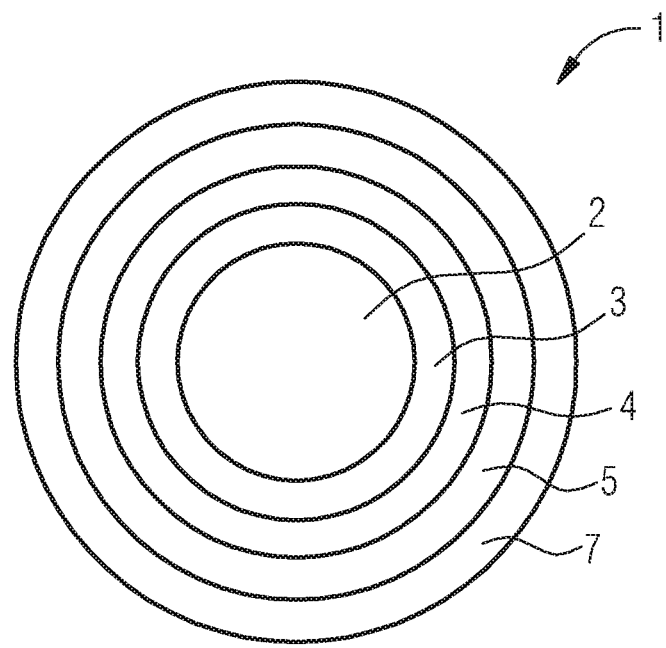

FIG. 3 shows the semiconductor nanocrystal structure 1 of FIG. 1 having an additional passivation shell 7 surrounding the outer absorption shell 5. The passivation shell 7 may include a material with a higher bandgap than the inner absorption shell 3 and the outer absorption shell 5. In a non-limiting embodiment, the passivation shell 7 may include the same material as the core 2, for example, ZnS.

Figure 4:
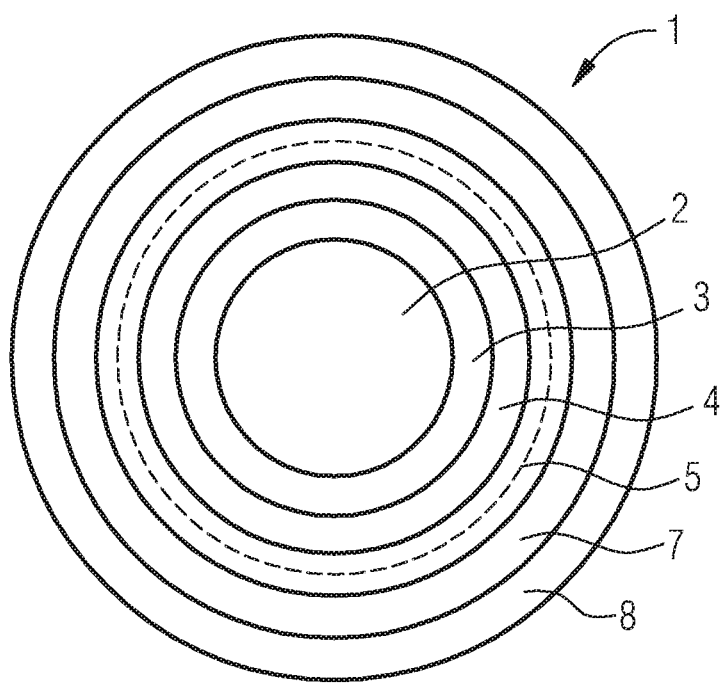

FIG. 4 shows the semiconductor nanocrystal structure 1 of FIG. 3 comprising an additional barrier layer 8 surrounding the passivation shell 7. The barrier layer 8 may include a dielectric material, for example, a metal oxide, such as silica. The barrier layer 8 can have a thickness of 10 nm inclusive to 100 μm inclusive. FIG. 4 also depicts a dotted line in the outer absorption shell 5 for exemplarily showing that the shell may include at least two regions. In particular, any of the shells depicted in the exemplary embodiments may include at least two regions.

Figure 5:
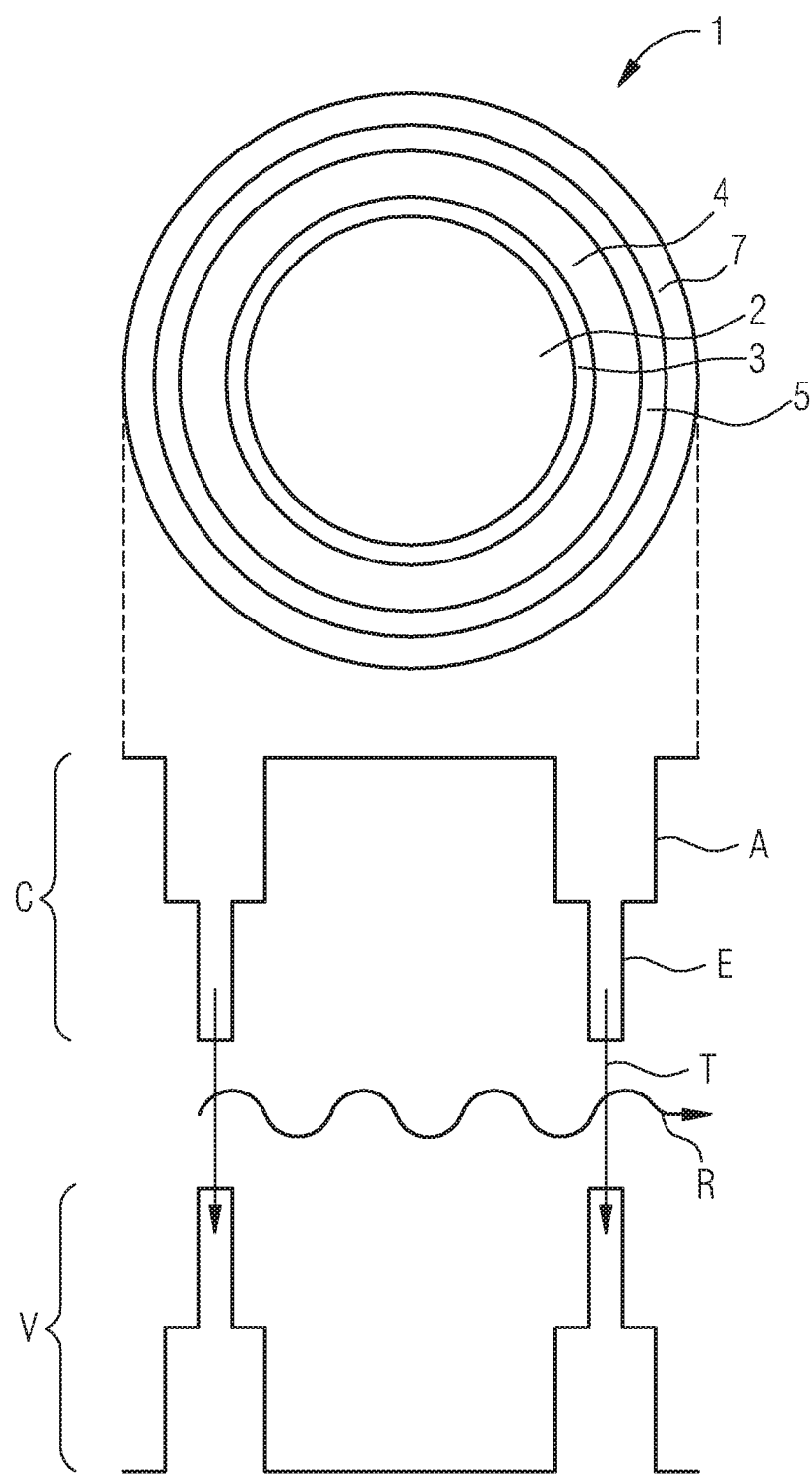
FIG. 5 shows a schematic illustration of a semiconductor nanocrystal structure and its energy bands according to one embodiment.

FIG. 5 shows the semiconductor nanocrystal structure 1 of FIG. 3 in conjunction with a schematic illustration of the energy states of the valence band V and the conductive band C. The absorption bands A of the inner absorption shell 3 and the outer absorption shell 5 have a higher band gap than the emission band E of the emission shell 4. Thus, the absorption and the emission are spectrally separated. Thus, radiation R emitted via a radiative transition T from the emission band E cannot be reabsorbed by the absorption shells 3,5. The core 2 and the passivation shell 7 have even higher band gaps than the inner absorption shell 3 and the outer absorption shell 5, thus being less absorbent than the absorption shells 3,5 in the specific target wavelength range.

The spectral separation of the absorption and the emission can be achieved by quantum confinement effects. Tables 1-3 in conjunction with FIG. 6 demonstrate the total absorption volume of two comparative examples and an exemplary embodiments.

Figure 6A:
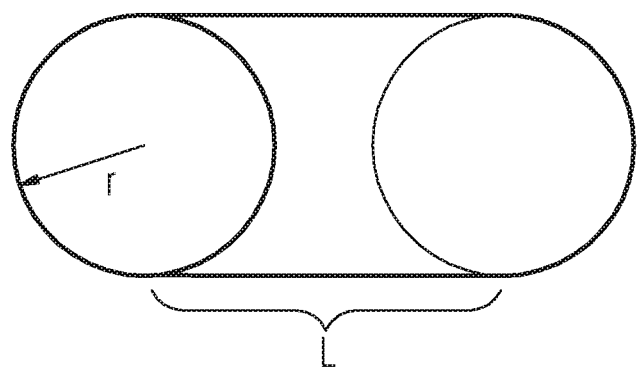
FIGS. 6A and 6B show schematic illustrations of a rod and a sphere.

Table 1 in conjunction with FIG. 6A shows the total absorption volume of a comparative example of a conventional rod shaped absorber. The core volume of a core with a diameter of 3 nm (not explicitly listed) was subtracted from the total volume of the rod-shaped absorber to obtain the total absorption volume.

Figure 6B:
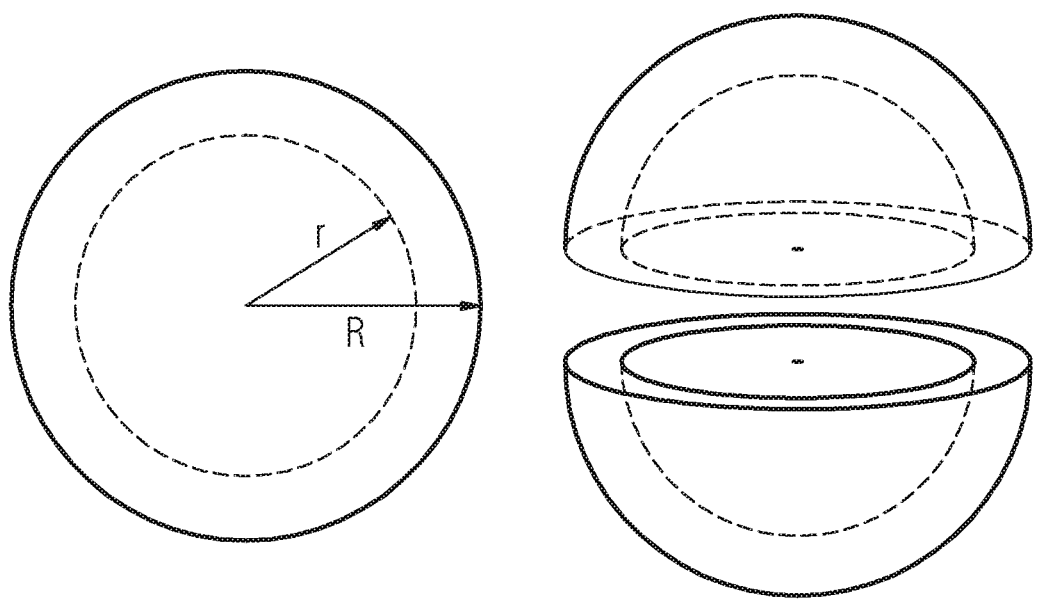

Table 2 in conjunction with FIG. 6B depicts the total absorption volume of a comparative example of a spherical absorber. A similar total absorber volume is achieved in a relatively small spherical absorber with core and shell thicknesses in the range of 2 to 3 nm as for the conventional rod shaped absorber.

Table 3 in conjunction with FIG. 6B depicts the total absorption volume of a semiconductor nanocrystal structure 1 with shell thicknesses kept in the range of 2 to 3 nm where quantum confinement effects can be dominant in determining the bandgap of the respective shell. Table 3 shows an exemplary embodiment of a spherical semiconductor nanocrystal structure which has similar particle dimensions of 20 nm along the largest dimension as the conventional rod shaped absorber as well as similar shell thicknesses as the spherical absorber. Despite similar particle dimensions or shell thicknesses, a much higher total absorber volume is achieved for the spherical semiconductor nanocrystal structure than for the conventional rod shaped absorber and the spherical absorber.

TABLE 1

| r (nm) | L (nm) | V (nm³) | |
|---|---|---|---|
| 5 | 20 | 1570 | Total volume |
|   |   | 1556 | Total absorption volume |

TABLE 2

| r (nm) | R (nm) | V (nm³) | |
|---|---|---|---|
| 0 | 3 | 113 | Inner absorption shell |
| 3 | 5 | 410 | Emission shell |
| 5 | 8 | 1620 | Outer absorption shell |

TABLE 2-continued

| r (nm) | R (nm) | V (nm³) | |
|---|---|---|---|
| | | 2144 | Total volume |
| | | 1733 | Total absorption volume |

TABLE 3

| r (nm) | R (nm) | V (nm³) | |
|---|---|---|---|
| 12 | 15 | 6895 | Inner absorption shell |
| 15 | 17 | 6439 | Emission shell |
| 17 | 20 | 12,924 | Outer absorption shell |
| | | 26,259 | Total volume |
| | | 19,820 | Total absorption volume |

Figure 7:
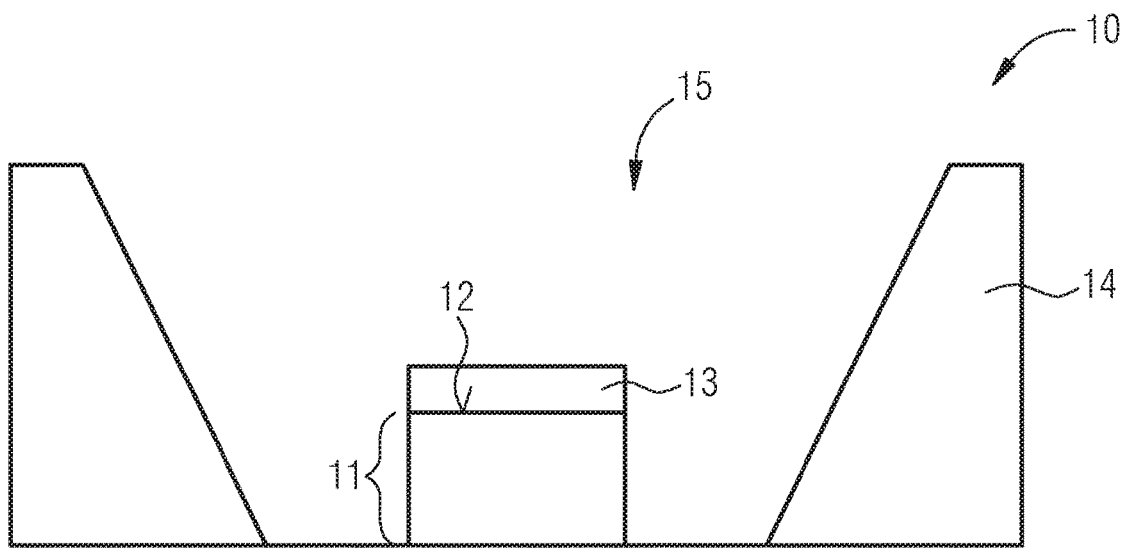
FIGS. 7 and 8 each show a schematic illustration of an optoelectronic device according to different embodiments.
Figure 8:
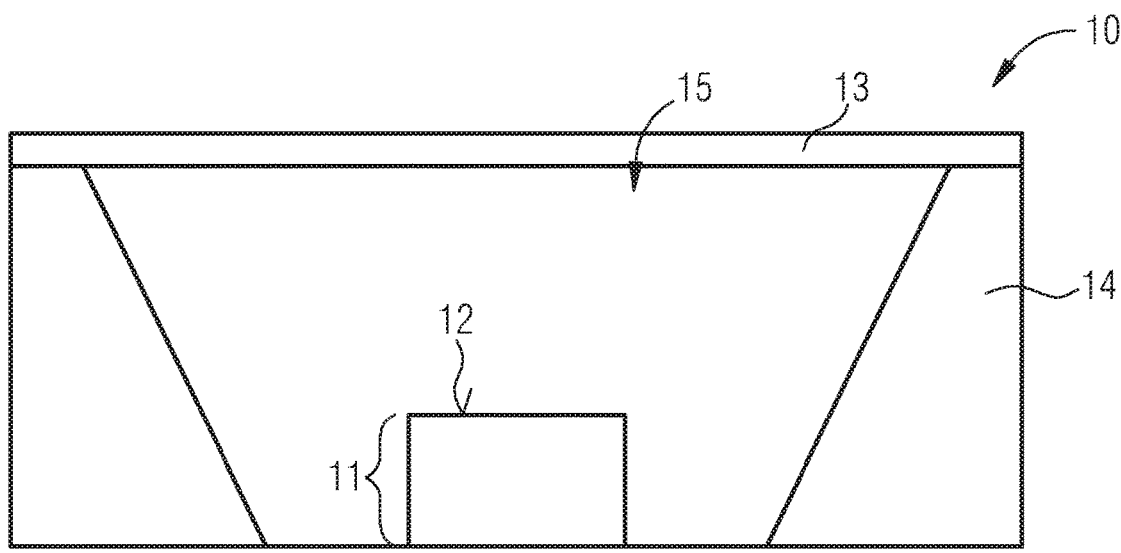

FIG. 7 shows a schematic illustration of an optoelectronic device 10 with a semiconductor chip 11 with an active layer stack and an active region (not explicitly shown here). The semiconductor chip 11 emits a primary radiation during operation of the optoelectronic device 10. In particular, the primary radiation is electromagnetic radiation in the visible wavelength range, such as in a wavelength range with wavelengths greater than 400 nm. The primary radiation is emitted from the radiation emission surface 12 of the semiconductor chip 11.

The optoelectronic device 10 may include a conversion element comprising a semiconductor nanocrystal structure. The semiconductor nanocrystal structure can be embedded in a matrix material such as silicone, polysiloxane or epoxy. The semiconductor nanocrystal structure and the conversion element 13 is configured or designed to absorb the primary radiation and convert the primary radiation at least partially or completely into secondary radiation. The secondary radiation is electromagnetic radiation with a wavelength range at least partially, such as completely, different than the wavelength range of the primary radiation. For example, the conversion element 13 converts the primary radiation into secondary radiation in the visible wavelength range.

The conversion element 13 is applied to the radiation emission surface 12 of the semiconductor chip 11 in direct mechanical contact. Alternatively the conversion element can be applied to the radiation emission surface 12 of the semiconductor chip 11 with adhesive layer (not shown here).

As shown in the exemplary embodiment of FIG. 7, the semiconductor chip 11 and the conversion element 13 are embedded in the recess 15 of a housing 14. In particular, the recess 15 can be filled at least partially, or completely, with an encapsulation such as silicone, polysiloxane, epoxy, or combinations thereof. In particular, the semiconductor chip 11 and the conversion element 13 are completely embedded in the encapsulation.

In contrast to the exemplary embodiment of an optoelectronic device shown in FIG. 3, the conversion element 13 in the exemplary embodiment of an optoelectronic device shown in FIG. 4 is spaced apart from the semiconductor chip 11. For instance, an encapsulation or other layers or elements can be arranged in the recess 15 between the semiconductor chip 11 and the conversion element 13. Alternatively, the recess 15 is free of an encapsulation or other layers or elements.

Alternatively the housing 14 can have no side walls and thus no recess 15 and can be formed as a carrier (not shown here).

The features and exemplary embodiments described in connection with the figures can be combined with each other according to further exemplary embodiments, even if not all combinations are explicitly described. Furthermore, the exemplary embodiments described in connection with the figures may have alternative or additional features as described in the general part.

The invention is not restricted to the embodiments mentioned in the description on the basis of said exemplary embodiments. Rather, the invention encompasses any new feature and also any combination of features, which in particular may include any combination of features in the patent claims and any combination of features in the exemplary embodiments, even if this feature or this combination itself is not explicitly specified in the patent claims or exemplary embodiments.

REFERENCES 1 semiconductor nanocrystal structure
2 core
3 inner absorption shell
4 emissive shell
5 outer absorption shell
6 intermediate absorption shell
7 passivation shell
8 barrier layer
10 optoelectronic device
11 semiconductor chip
12 radiation emission surface
13 conversion element
14 housing
15 recess
V valence band
C conductive band
A absorption band
E emission band
T radiative transition
R radiation

What is claimed is:

1. A semiconductor nanocrystal structure comprising:
    a core;
    an inner absorption shell surrounding the core;
    at least one emission shell surrounding the inner absorption shell; and
    an outer absorption shell surrounding the at least one emission shell;
    wherein the core comprises a different material than the inner absorption shell and/or the outer absorption shell;
    and wherein the core absorbs less electromagnetic radiation as compared to the inner absorption shell and/or the outer absorption shell.

2. The semiconductor nanocrystal structure according to claim 1,
    wherein the inner absorption shell, the at least one emission shell, and the outer absorption shell form a quantum well structure.

3. The semiconductor nanocrystal structure according to claim 1, wherein a bandgap increases as the thickness of the at least one emission shell, the inner absorption shell, the outer absorption shell, or combinations thereof decreases.

4. The semiconductor nanocrystal structure according to claim 1,
wherein the at least one emission shell, the inner absorption shell, the outer absorption shell, or combinations thereof is quantum confined.

5. The semiconductor nanocrystal structure according to claim 1,
wherein the semiconductor nanocrystal structure is spheroidal.

6. The semiconductor nanocrystal structure according to claim 1,
wherein a thickness of the at least one emission shell is less than or equal to 10 nm.

7. The semiconductor nanocrystal structure according to claim 1,
wherein a thickness of the inner absorption shell and/or the outer absorption shell is less than or equal to 10 nm.

8. The semiconductor nanocrystal structure according to claim 1,
wherein the inner absorption shell and the outer absorption shell comprise the same material.

9. The semiconductor nanocrystal structure according to claim 1,
wherein the core absorbs less electromagnetic radiation in the visible wavelength range as compared to the inner absorption shell and/or the outer absorption shell.

10. The semiconductor nanocrystal structure according to claim 1,
further comprising a passivation shell surrounding the outer absorption shell.

11. The semiconductor nanocrystal structure according to claim 10,
wherein the core and the passivation shell comprise the same material.

12. The semiconductor nanocrystal structure according to claim 10,
further comprising a barrier layer surrounding the passivation shell.

13. The semiconductor nanocrystal structure according to claim 1,
wherein the at least one emission shell, the inner absorption shell, the outer absorption shell, or combinations thereof comprises at least two regions.

14. The semiconductor nanocrystal structure according to claim 1,
wherein the at least one emission shell comprises a plurality of emission shells; and further comprising an intermediate absorption shell arranged between each emission shell of the plurality of emission shells.

15. The semiconductor nanocrystal structure according to claim 1,
wherein the shells are blended at interfaces between the shells.

16. An optoelectronic device comprising:
a semiconductor chip configured to emit a primary radiation;
a conversion element configured to convert at least part of the primary radiation into a secondary radiation;
wherein the conversion element comprises a plurality of semiconductor nanocrystal structures; wherein each semiconductor nanocrystal structure of the plurality of semiconductor nanocrystal structures comprises:
a core;
an inner absorption shell surrounding the core;
at least one emission shell surrounding the inner absorption shell;
an outer absorption shell surrounding the at least one emission shell,
wherein the core comprises a different material than the inner absorption shell and/or the outer absorption shell; and wherein the core absorbs less electromagnetic radiation as compared to the inner absorption shell and/or the outer absorption shell.

17. The optoelectronic device according to claim 16, wherein the conversion element is arranged in direct mechanical contact to the semiconductor chip.

18. The optoelectronic device according to claim 16, wherein the conversion element and the semiconductor chip are spaced apart.

19. The optoelectronic device according to claim 16, wherein the conversion element comprises a matrix material, wherein at least a portion of the plurality of semiconductor nanocrystal structures are embedded in the matrix material.

* * * * *